United States Patent
Wong (10) Patent No.: US 7,898,288 B2
(45) Date of Patent: Mar. 1, 2011

(54) INPUT TERMINATION FOR DELAY LOCKED LOOP FEEDBACK WITH IMPEDANCE MATCHING

(75) Inventor: Tak Kwong Wong, Milpitas, CA (US)

(73) Assignee: Integrated Device Technology, inc., San Jose, CA (US)

( * ) Notice: Subject to any disclaimer, the term of this patent is extended or adjusted under 35 U.S.C. 154(b) by 139 days.

(21) Appl. No.: 11/608,234

(22) Filed: Dec. 7, 2006

(65) Prior Publication Data

US 2008/0136443 A1    Jun. 12, 2008

(51) Int. Cl.
 *H03K 17/16* (2006.01)
(52) U.S. Cl. .......................................... 326/30
(58) Field of Classification Search ............. 326/30
 See application file for complete search history.

(56) References Cited

U.S. PATENT DOCUMENTS

| | | | |
|---|---|---|---|
| 5,760,610 A * | 6/1998 | Naffziger | 326/93 |
| 6,812,754 B1 * | 11/2004 | Nakanishi | 327/157 |
| 2003/0001618 A1 * | 1/2003 | Haycock et al. | 326/82 |

* cited by examiner

*Primary Examiner* — Rexford N Barnie
*Assistant Examiner* — Thienvu V Tran
(74) *Attorney, Agent, or Firm* — Bever Hoffman & Harms LLP (57) ABSTRACT

A reference output circuit for generating an output clock signal for driving signals off of an integrated circuit chip uses a switched terminated load in combination with an output buffer to generate a feedback clock signal, which is used, in combination with a reference input clock signal, to generate the output clock signal. The switched terminated load uses transistors having the same size as transistors in the output buffer. The switched terminated load draws the same DC current as the output buffer. As a result, the switched terminated load and the output buffer have the same electro-migration performance. Pull-up and pull-down MOS impedances of the switched terminated load are easily adjusted during switching periods of the switched terminated load. The design of the switched terminated load minimizes variations in the terminated load impedance due to MOS impedance variations.

16 Claims, 9 Drawing Sheets

INPUT TERMINATION FOR DELAY LOCKED LOOP FEEDBACK WITH IMPEDANCE MATCHING

FIELD OF THE INVENTION

The present invention relates to an output circuit of an integrated circuit device. More specifically, the present invention relates to a circuit and method for generating an output clock signal in an integrated circuit device.

RELATED ART

Figure 1:
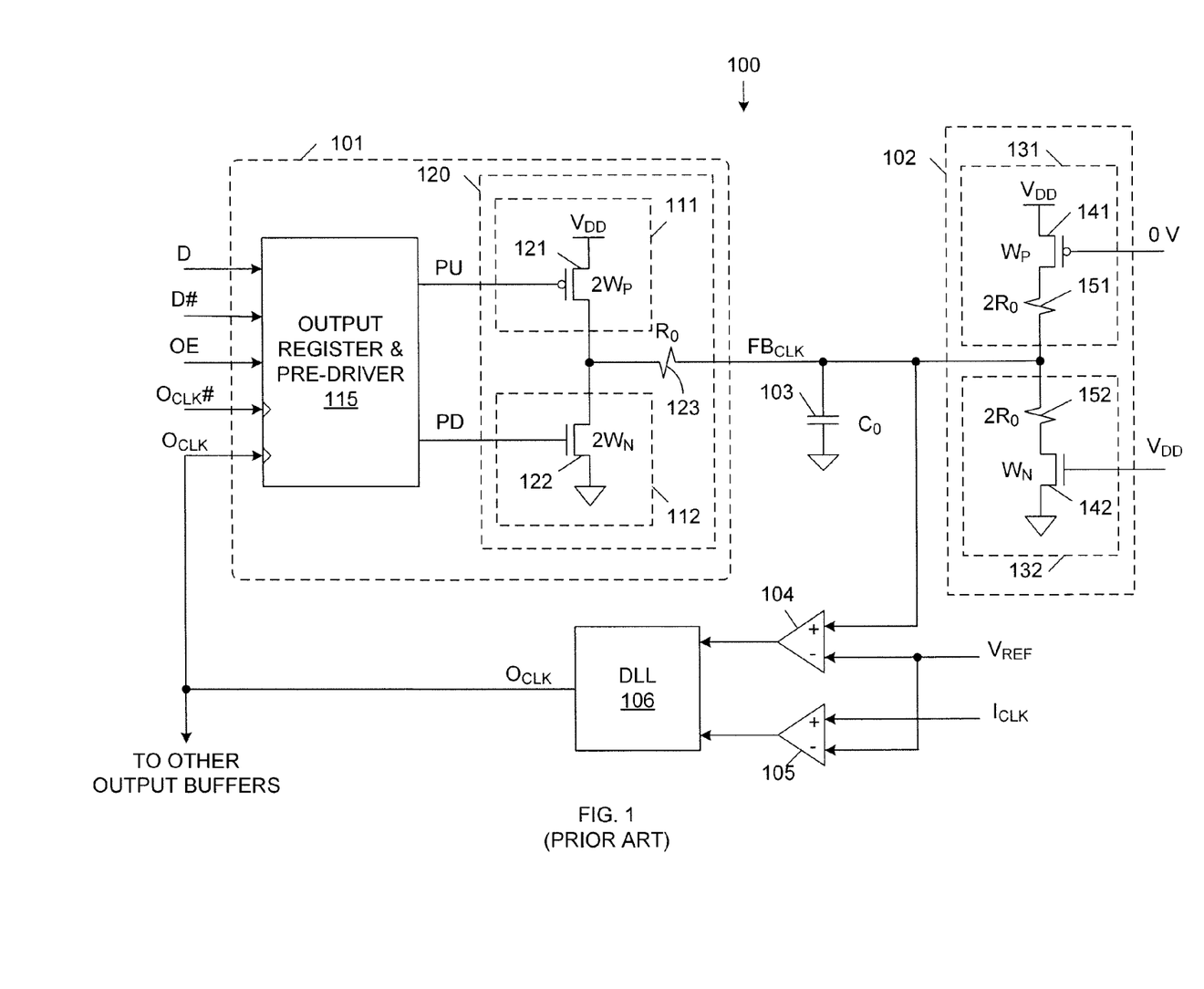
FIG. 1 is a circuit diagram of a conventional reference output circuit.

FIG. 1 is a block diagram of a reference output circuit 100 of a conventional integrated circuit. Reference output circuit 100 includes reference output buffer 101, terminated load module 102, capacitor 103, comparators 104-105 and delay locked loop (DLL) circuit 106. Reference output buffer 101 includes output register/pre-driver circuit 115 and output driver module 120. Output driver module 120, in turn, includes pull-up circuit 111 (i.e., PMOS transistor 121), pull-down circuit 112 (i.e., NMOS transistor 122) and resistor 123. Terminated load module 102 includes pull-up circuit 131 (i.e., PMOS transistor 141 and resistor 151) and pull-down circuit 132 (i.e., NMOS transistor 142 and resistor 152).

Output register/pre-driver circuit 115 includes terminals for receiving complementary driver control signals D and D#, output enable signal OE, and complementary output clock signals $O_{CLK}$ and $O_{CLK}\#$. In response, output register/pre-driver circuit 110 provides a pull-up signal (PU) to the gate of PMOS transistor 121 in pull-up circuit 111, and a pull-down signal (PD) to the gate of NMOS transistor 122 in pull-down circuit 112.

Pull-up and pull-down circuits 111 and 112, in turn, provide a feedback clock signal $FB_{CLK}$, which is applied to the positive input terminal of comparator 104 via a feedback path that includes terminated load module 102 and capacitor 103. This feedback path is typically hidden inside the integrated circuit package. Pull-up circuit 111 is configured to pull up the feedback clock signal $FB_{CLK}$ toward a positive supply voltage $V_{DD}$, and pull-down circuit 112 is configured to pull down the feedback clock signal $FB_{CLK}$ toward a ground supply voltage.

Comparator 104 compares the feedback clock signal $FB_{CLK}$ with a DC reference voltage $V_{REF}$ (which is applied to the negative input terminal of comparator 104). Similarly, comparator 105 compares an input reference clock signal $I_{CLK}$ with the reference voltage $V_{REF}$. The DC reference voltage $V_{REF}$ is set to the cross-over point of the received clock signals $FB_{CLK}$ and $I_{CLK}$ (e.g., $V_{DD}/2$). Thus, the outputs of comparators 104 and 105 switch in response to the changing states of the feedback clock signal $FB_{CLK}$ and the input reference clock $I_{CLK}$, respectively.

The outputs of comparators 104 and 105 are provided to DLL circuit 106. In response, DLL circuit 106 provides the output clock signal $O_{CLK}$. DLL circuit 106 generates the output clock signal $O_{CLK}$ by introducing a delay to the input reference clock signal $I_{CLK}$, wherein the introduced delay is selected in response to the output signals provided by comparators 104 and 105. More specifically, the delay introduced by DLL circuit 106 is selected to synchronize the feedback clock signal $FB_{CLK}$ with the input reference clock signal $I_{CLK}$.

Figure 2:
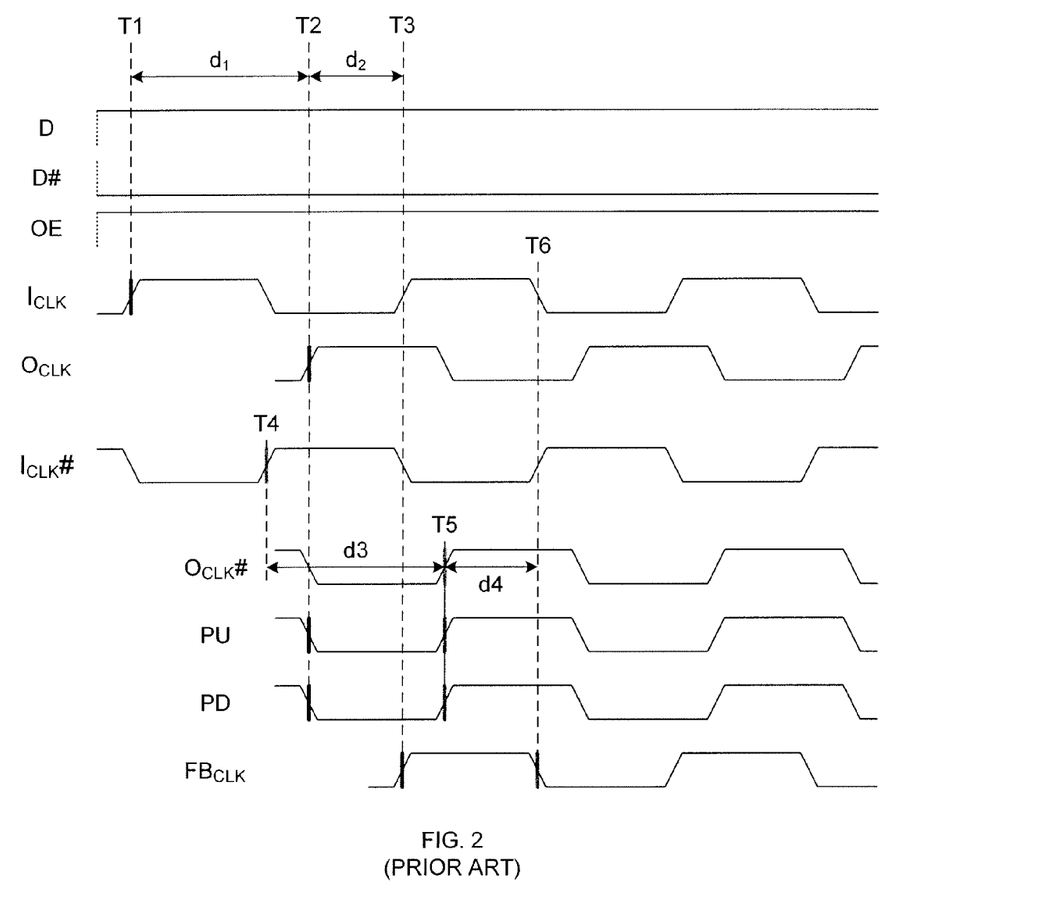
FIG. 2 is a waveform diagram illustrating various signals of the conventional reference output circuit of FIG. 1.

FIG. 2 is a waveform diagram illustrating various signals of reference output circuit 100. The output enable signal OE is activated high, thereby enabling output register/pre-driver circuit 115. Driver control signals D and D# are selected to have a logic high state and a logic low state, respectively.

Under these conditions, output register/pre-driver 115 will control the pull-up control signal PU and the pull-down control signal PD in the following manner, in response to the output clock signal $O_{CLK}$ (and the complementary output clock signal $O_{CLK}\#$).

At time T1, the input reference clock signal $I_{CLK}$ transitions from a logic '0' state to a logic '1' state (rising edge). DLL circuit 106 introduces a delay (d1—comparator delay) to the input reference clock signal $I_{CLK}$, such that the output clock signal $O_{CLK}$ transitions from a logic '0' state to a logic '1' state (rising edge) at time T2. Output register/pre-driver 115 drives the pull-up control signal PU and the pull-down control signal PD to logic '0' values in response to the rising edge of the output clock signal $O_{CLK}$. The short inherent delays that exist between the rising edge of the output clock signal $O_{CLK}$ and the falling edges of the pull-up control signal PU and the pull-down control signal PD are not shown in FIG. 2 for purposes of clarity.

The logic '0' states of the pull-up and pull-down control signals PU and PD cause PMOS transistor 121 to turn on and NMOS transistor 122 to turn off, thereby pulling up the feedback clock signal $FB_{CLK}$ toward the $V_{DD}$ supply voltage. Capacitor 103 and terminated load module 102 introduce a delay (d2) to the rise of the feedback clock signal, such that the feedback clock signal transitions from a logic '0' state to a logic '1' state (rising edge) at time T3. As illustrated in FIG. 2, the delays d1 and d2 cause the rising edge of the feedback clock signal $FB_{CLK}$ to be synchronized with the rising edge of the input reference clock signal $I_{CLK}$ at time T3.

The complementary output clock signal $O_{CLK}\#$ is generated in a second reference output circuit (not shown) that is identical to reference output circuit 100. This second reference output circuit generates the complementary output clock signal $O_{CLK}\#$ (and a corresponding complementary feedback clock signal $FB_{CLK}\#$) in response to a complementary input reference clock signal $I_{CLK}\#$ (which is the complement of the input reference clock signal $I_{CLK}$).

The complementary output clock signal $O_{CLK}\#$ is provided to output register/pre-driver 115. As illustrated in FIG. 2, a rising edge of the complementary input clock signal $I_{CLK}\#$ occurs at time T4, and a rising edge of the complementary output clock signal $O_{CLK}\#$ follows at time T5 (after a delay d3). Output register/pre-driver 115 drives the pull-up control signal PU and the pull-down control signal PD to logic '1' values in response to the rising edge of the complementary output clock signal $O_{CLK}\#$. Again, the short inherent delays between the rising edge of the complementary output clock signal $O_{CLK}\#$ and the rising edges of the pull-up control signal PU and the pull-down control signal PD are not shown in FIG. 2 for purposes of clarity.

The logic '1' states of the pull-up and pull-down control signals PU and PD cause PMOS pull-up transistor 121 to turn off and NMOS pull-down transistor 122 to turn on, thereby pulling down the feedback clock signal $FB_{CLK}$ toward the ground supply voltage. Capacitor 103 and terminated load module 102 introduce a delay (d4) to the fall of the feedback clock signal $FB_{CLK}$, such that the feedback clock signal transitions from a logic '1' state to a logic '0' state (falling edge) at time T6. As illustrated in FIG. 2, the delays d3 and d4 cause the falling edge of the feedback clock signal $FB_{CLK}$ to be synchronized with the rising edge of the complementary reference input clock signal $I_{CLK}\#$ at time T6.

If the polarity of the driver control signals D and D# are reversed, the polarity of the pull-up and pull-down control signals PU and PD would also be reversed.

The purpose of reference output circuit 100 is to align the output signals that are driven off the integrated circuit chip with the input reference clock signal $I_{CLK}$. To accomplish this purpose, reference output buffer 101 is designed to be identical to other output buffers (not shown) on the same integrated circuit. In addition, the feedback path from the output of reference output buffer 101 to the input of comparator 104 is designed to emulate the output paths of these other output buffers. That is, the feedback clock signal $FB_{CLK}$ is designed to have the same switching time as the other outputs of the integrated circuit.

By using the output clock signal $O_{CLK}$ to control the other output buffers of the integrated circuit, the output signals provided by these other output buffers will also be synchronized with the input reference clock signal $I_{CLK}$.

The feedback path from the output of reference output buffer 101 to the input of comparator 104 is designed as follows. The capacitance $C_o$ of output capacitor 103 is selected to match the capacitance (including the package capacitance) seen by a typical output buffer of the integrated circuit. Thus, the reference output buffer 101 sees the same capacitance as the other output buffers on the same integrated circuit.

The feedback path from reference output buffer 101 to comparator 104 is further designed to implement impedance matching. In high speed applications, output impedance matching with input termination is used to minimize switching noise and signal reflection. Terminated load module 102 is therefore included in the feedback path to emulate output impedance matching with input termination.

The on-resistance of pull-up circuit 111 and pull-down circuit 112 (as well as the on-resistances of the other output buffers on the integrated circuit) is controlled to be R, wherein R is user programmable (e.g., by coupling a resistor having a resistance equal to 5R to a pin of the integrated circuit). To implement impedance matching, the input termination of an external load will have the same resistance R coupled to a voltage equal to the power supply voltage $V_{DD}$ divided by two ($V_{DD}/2$). To mimic this external load configuration, terminated load module 102 includes a pull-up circuit 131 coupled to a $V_{DD}$ voltage supply terminal through a resistance of 2R, and a pull-down circuit 132 coupled to a ground supply terminal through a resistance of 2R. Pull-up circuit 131 is continuously enabled by applying a ground supply voltage (0 Volts) to the gate of PMOS transistor 141. Similarly, pull-down circuit 132 is continuously enabled by applying the $V_{DD}$ supply voltage to the gate of NMOS transistor 142. When enabled, pull-up circuit 131 and pull-down circuit 132 are the equivalent of a circuit having a resistor with resistance R coupled to a voltage of $V_{DD}/2$.

Reference output circuit 100 implements a digital impedance matching scheme, wherein the resistance of the output buffer 101 is controlled by turning on a selected number of parallel output driver modules (not shown), identical to output driver module 120. If the parallel output driver modules are identical, then the output resistance is equal to the resistance of one module divided by the number of turned on modules. Typically, a small number of parallel output driver modules with progressive fine resistance differences are used to increase the resolution of the output resistance.

The output resistance of pull-up circuit 111 (i.e., R) is equal to the on-resistance of PMOS transistor 121 plus the resistance of resistor 123. Similarly, the output resistance of pull-down circuit 112 (i.e., R) is equal to the on-resistance of NMOS transistor 122 plus the resistance of resistor 123. The resistances of PMOS transistor 121, NMOS transistor 122 and resistor 123 are designated $R_{PM}$, $R_{NM}$ and $R_0$, respectively. Thus, the output resistance R of pull-up circuit 111 is equal to $R_{PM}+R_0$, and the output resistance R of pull-down circuit 112 is equal to $R_{NM}+R_0$. Resistances $R_{PM}$ and $R_{NM}$ are selected to be equal to the same resistance ($R_T$) in typical conditions. As a result, the output resistance R of output driver module 120 is equal to $R_0+R_T$.

Although the MOS resistances $R_{PM}$ and $R_{NM}$ vary in response to the output voltage, the effect of these variations is minimized by making resistance $R_0$ much greater than $R_{PM}$ and $R_{NM}$. The parallel output driver modules that are enabled for pull-up and pull-down operations can be different to compensate for the different resistances exhibited by PMOS transistors and NMOS transistors.

To implement impedance matching within terminated load module 102, each of resistors 151 and 152 is given a resistance equal to $2R_0$, PMOS transistor 141 is given an on-resistance equal to $2R_{PM}$, and NMOS transistor 142 is given an on-resistance equal to $2R_{NM}$. The on-resistance $R_{PM}$ of PMOS transistor 121 is equal to $K_P/2W_P$, where $2W_P$ represents the channel width of PMOS transistor 121 and $K_P$ is a constant that depends on technology, voltage and temperature. Assuming that PMOS transistors 121 and 141 have the same channel length, the on-resistance of PMOS transistor 141 is equal to $K_P/W_P$, wherein $W_P$ represents the channel width of transistor 141. Thus, making the channel of PMOS transistor 121 twice as wide as the channel of PMOS transistor 141 causes the on-resistance of PMOS transistor 141 to be twice the on-resistance of PMOS transistor 121. NMOS transistors 122 and 142 are designed in the same manner as PMOS transistors 121 and 141, such that the on-resistance of NMOS transistor 142 is twice the on-resistance of NMOS transistor 122.

Because resistance $R_{PM}$ and resistance $R_{NM}$ are equal (i.e., to resistance $R_T$), the equivalent resistance of terminated load module 102 is therefore equal to $\frac{1}{2}(2R_0+2R_T)$ or $R_0+R_T$. Thus, the resistance of the terminated load module 102 is equal to the output resistance of output buffer module 120.

There are two main problems associated with reference output circuit 100. First, the resistance R of output driver module 120 is continuously monitored and adjusted to account for voltage and temperature changes. Consequently, the resistance 2R of terminated load module 102 must also be updated. However, the resistance of terminated load module 102 cannot be updated during the rising or falling transitions of the feedback clock signal $FB_{CLK}$, because such updates would interfere with the timing accuracy of reference output circuit 100, and therefore introduce clock jitter. Thus, the resistance of terminated load module 102 must be updated between transitions in the feedback clock signal $FB_{CLK}$. This is typically accomplished by adjusting the resistance of terminated load module 102 one quarter cycle after each transition of the feedback clock signal $FB_{CLK}$. This timing is accomplished using a quarter-cycle delay circuit, which undesirably adds complexity and increased layout area to reference output circuit 100.

Second, different electro-migration conditions will exist in output driver module 120 and terminated load module 102. When the feedback clock signal $FB_{CLK}$ has a logic "1" value, the DC currents flowing through pull-up circuit 111 and pull-down circuit 112 in output driver module 120 are (0.25) $V_{DD}/R$ and 0 Amps, respectively. Under these conditions, the DC currents flowing through pull-up circuit 131 and pull-down circuit 132 of terminated load circuit 102 are (0.125) $V_{DD}/R$ and (0.375)$V_{DD}/R$ Amps, respectively. Note that the logic high voltage of the feedback clock signal $FB_{CLK}$ is equal to (0.75)$V_{DD}$.

Conversely, when the $FB_{CLK}$ signal has a logic "0" value, the DC currents flowing through pull-up circuit 111 and pull-down circuit 112 in output driver module 120 are 0 and $(0.25)V_{DD}/R$ Amps, respectively. Under these conditions, the DC currents flowing through pull-up circuit 131 and pull-down circuit 132 of terminated load circuit 102 are $(0.375)V_{DD}/R$ and $(0.125)V_{DD}/R$ Amps, respectively. Note that the logic low voltage of the feedback clock signal $FB_{CLK}$ is equal to $(0.25)V_{DD}$.

The average DC current flowing in pull-up circuit 111 and pull-down circuit 112 of the output driver module 120 is $(0.125)V_{DD}/R$. In contrast, the average DC current flowing in pull-up circuit 131 and pull-down circuit 132 of terminated load module 102 is $(0.25)V_{DD}/R$. Thus, the average current in terminated load module 102 is twice the average current in output driver module 120 for purposes of electro-migration consideration.

For layout and parasitic matching, PMOS transistor 141 only has half the amount of contacts and metal vias present in PMOS transistor 121 (because the PMOS transistor 141 has half the channel width of PMOS transistor 121). Electro-migration performance of PMOS transistor 141 is therefore one quarter the electro-migration performance of PMOS transistor 121. Additional contacts and metal vias may be added to PMOS transistor 141 to help equalize the electro-migration in output driver module 120 and terminated load module 102. However, this would require PMOS transistor 121 to drastically increase in size to achieve a matched layout. Note that NMOS transistors 122 and 142 exhibit the same electro-migration issues as PMOS transistors 121 and 141.

It would therefore be desirable to have a reference output circuit that does not exhibit the electro-migration discrepancies associated with reference output circuit 100. It would further be desirable to have a reference output circuit capable of adjusting the terminated load module at any time during a cycle of the feedback clock signal $FB_{CLK}$.

DETAILED DESCRIPTION

Figure 3:
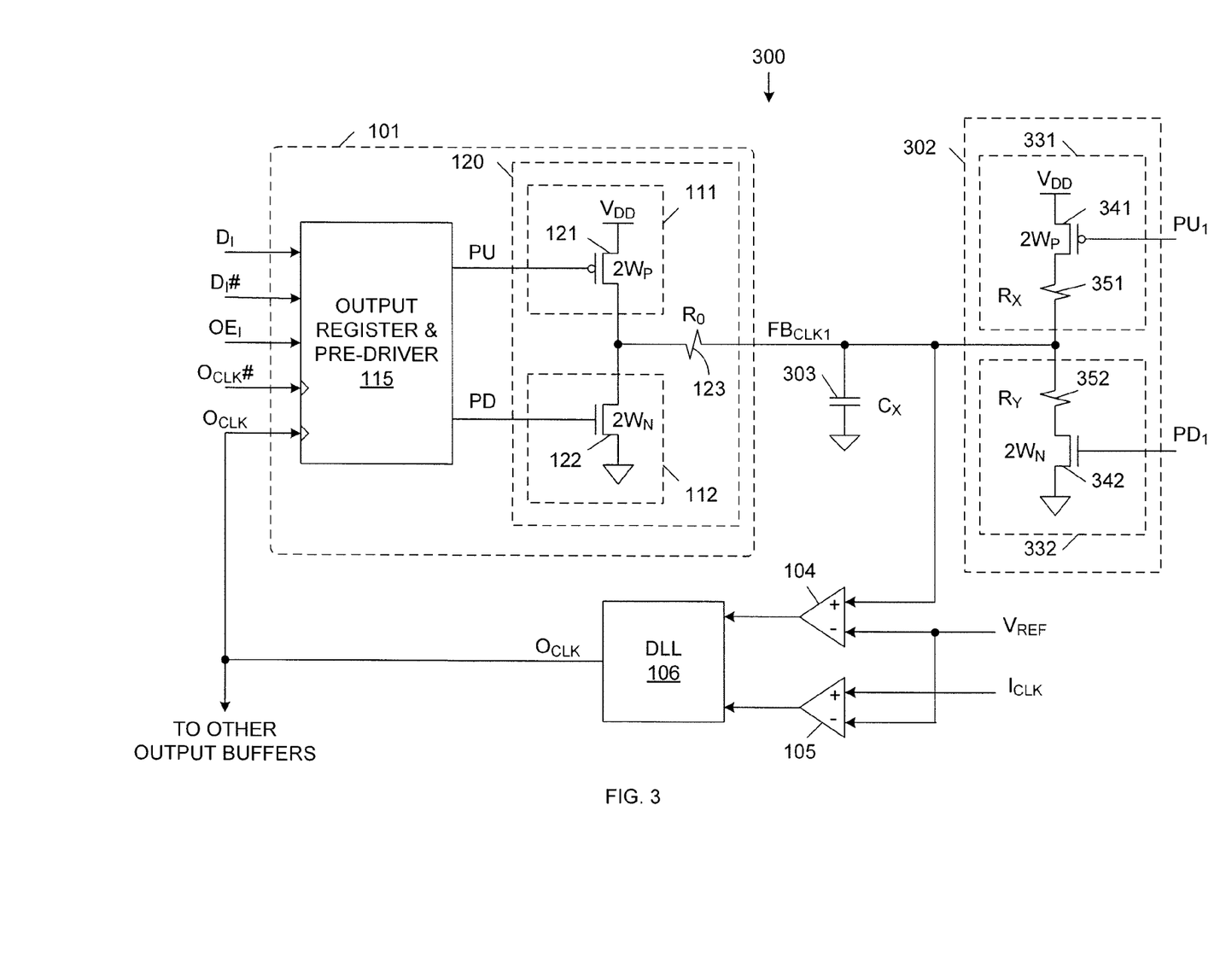
FIG. 3 is a circuit diagram of a reference output circuit in accordance with one embodiment of the present invention.

FIG. 3 is a circuit diagram of a reference output circuit 300 in accordance with one embodiment of the present invention.

Because reference output circuit 300 is similar to reference output circuit 100 (FIG. 1), similar elements in FIGS. 1 and 3 are labeled with similar reference numbers. Thus, reference output circuit 300 includes output buffer circuit 101, comparators 104-105 and delay locked loop (DLL) 106. Output buffer circuit 101 includes output register/pre-driver circuit 115 and output driver circuit 120. Output driver circuit 120 includes pull-up circuit 111 (PMOS transistor 121), pull-down circuit 112 (NMOS transistor 122), and resistor 123. As described above in connection with FIG. 1, PMOS pull-up transistor 121 has a channel width of $2W_P$ and an on-resistance of $R_{PM}$ (wherein $R_{PM}=K_P/2W_P$). Similarly, NMOS pull-down transistor 122 has a channel width of $2W_N$ and an on-resistance of $R_{NM}$ (wherein $R_{NM}=K_N/2W_N$). Resistor 123 has a resistance of $R_O$.

Capacitor 103 of reference output circuit 100 is replaced with capacitor 303 in reference output circuit 200. Capacitor 303 has a capacitance of $C_X$. In addition, the terminated load module 102 of reference output circuit 100 is replaced with terminated load module 302 in reference output circuit 300. Terminated load module 302 includes pull-up circuit 331 (i.e., PMOS pull-up transistor 341 and resistor 351) and pull-down circuit 332 (i.e., NMOS pull-down transistor 342 and resistor 352).

Within pull-up circuit 331, PMOS transistor 341 is designed to be identical to the PMOS transistor 121 in output buffer module 120. Consequently, PMOS pull-up transistor 341 has a channel width of $2W_P$ and an on-resistance $R_{PM}=K_P/2W_P$, just like PMOS pull-up transistor 121. Also within pull-up circuit 331, resistor 351 is designed to have a resistance $R_X$ so that the total pull-up resistance of pull-up circuit 331 is three times that of pull-up circuit 111. That is, $R_X+R_{PM}=3*(R_O+R_{PM})$.

Similarly, within pull-down circuit 332, NMOS transistor 342 is designed to be identical to the NMOS transistor 122 in output buffer module 120. Consequently, NMOS pull-down transistor 342 has a channel width of $2W_N$ and an on-resistance $R_{NM}=K_N/2W_N$, just like NMOS pull-down transistor 122. Also within pull-down circuit 332, resistor 352 is designed to have a resistance $R_Y$, so that $R_Y+R_{NM}=3*(R_O+R_{NM})$.

Note that the MOS resistance of terminated load module 302 (i.e., $K_P/2W_P$ and $K_N/2W_N$) is only half the MOS resistance of conventional terminated load module 102 (i.e., $K_P/W_P$ and $K_N/W_N$). Also note that the total resistance of terminated load module 302 is increased to 3R (from 2R in terminated load module 102). Consequently, the change in the resistance of terminated load module 302 due to changes in the on-resistances of MOS transistors 341 and 342 is reduced by a factor of about three in the present invention. Hence the terminated load module 302 of the present invention matches better to a passive resistor, which is the object of impedance matching.

Within terminated load module 302, the gate of PMOS pull-up transistor 341 is driven by a pull-up control signal $PU_1$, and the gate of NMOS pull-down transistor 342 is driven by a pull-down control signal $PD_1$. The manner in which the pull-up and pull-down control signals $PU_1$ and $PD_1$ are generated is described in more detail below. However, it is important to note that the pull-up and pull-down control signals $PU_1$ and $PD_1$ are switched signals (i.e., signals that change logic states), as opposed with the fixed state control signals used to control conventional terminated load module 102.

Figure 4:
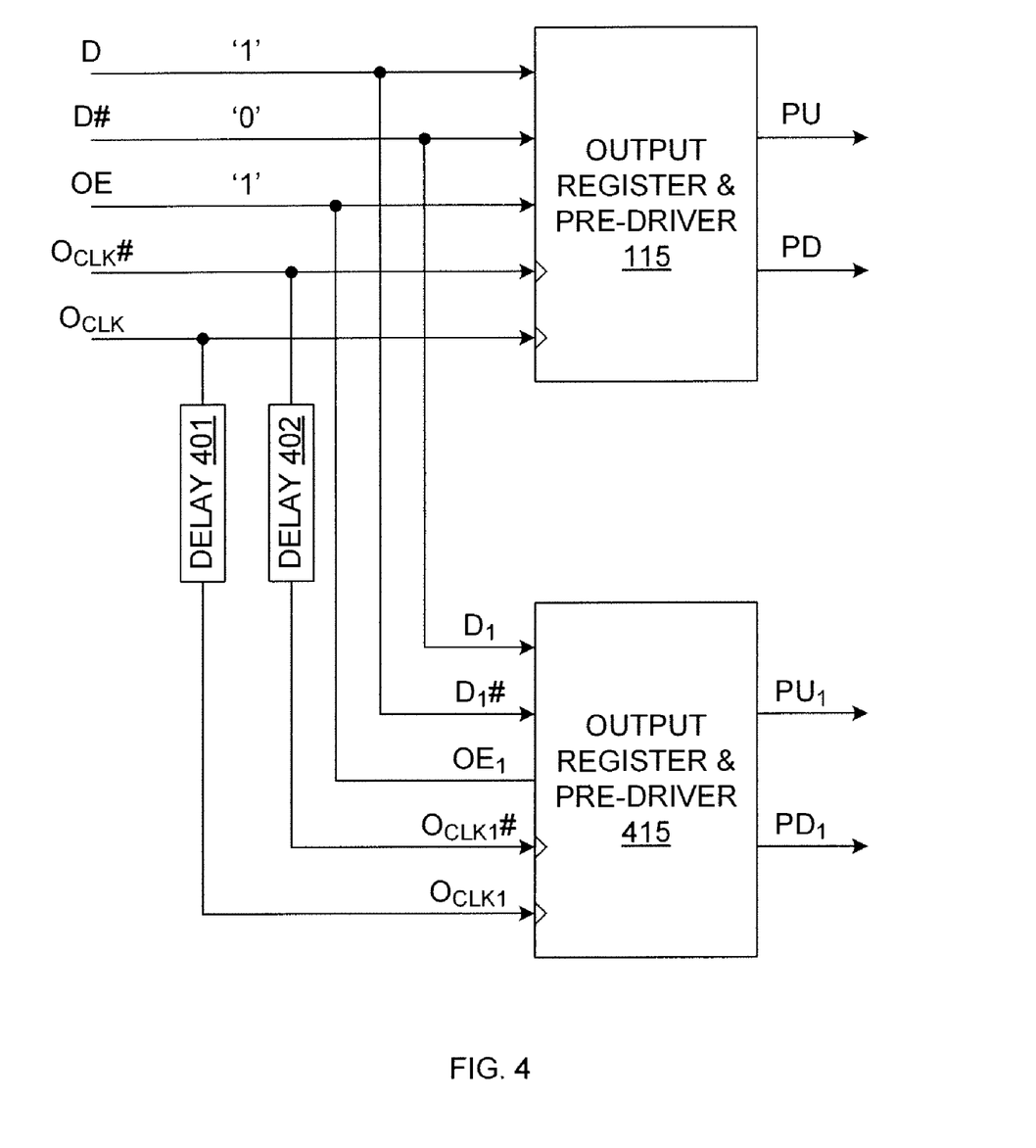
FIG. 4 is a block diagram that illustrates the manner in which the pull-up and pull-down control signals are generated for a terminated load module of the reference output circuit of FIG. 3, in accordance with one embodiment of the present invention.

FIG. 4 is a block diagram that illustrates the manner in which the pull-up and pull-down control signals $PU_1$ and $PD_1$ are generated. More specifically, FIG. 4 illustrates output register/pre-driver 115 (which is described above in connection with FIGS. 1 and 2), and output register/pre-driver 415. In the described embodiment, output register/pre-drivers 115 and 415 are identical circuits. Output register pre-driver 415 generates the pull-up and pull-down control signals $PU_1$ and $PD_1$ in response to driver control signals $D_1$ and $D_1\#$, output enable signal $OE_1$, output clock signal $O_{CLK1}$ and complementary output clock signal $O_{CLK1}\#$.

Driver control signals $D_1$ and $D_1\#$ have polarities that are the opposite of the polarities of driver control signals D and D#, respectively. In the illustrated embodiment, this is accomplished by routing the driver control signal D to output register/pre-driver 415 as the driver control signal $D_1\#$, and by routing the driver control signal D# to output register/pre-driver 415 as the driver control signal $D_1$. The output enable signal $OE_1$ has the same polarity as the output enable signal OE. In the described embodiment, the output enable signal OE is simply routed as the output enable signal $OE_1$. Output clock signals $O_{CLK1}$ and $O_{CLK1\#}$ are delayed versions of the output clock signals $O_{CLK}$ and $O_{CLK}\#$, respectively. Output clock signal $O_{CLK}$ is routed through delay circuit 401 to create output clock signal $O_{CLK1}$. Similarly, output clock signal $O_{CLK}\#$ is routed through delay circuit 402 to create output clock signal $O_{CLK1}\#$.

Figure 5:
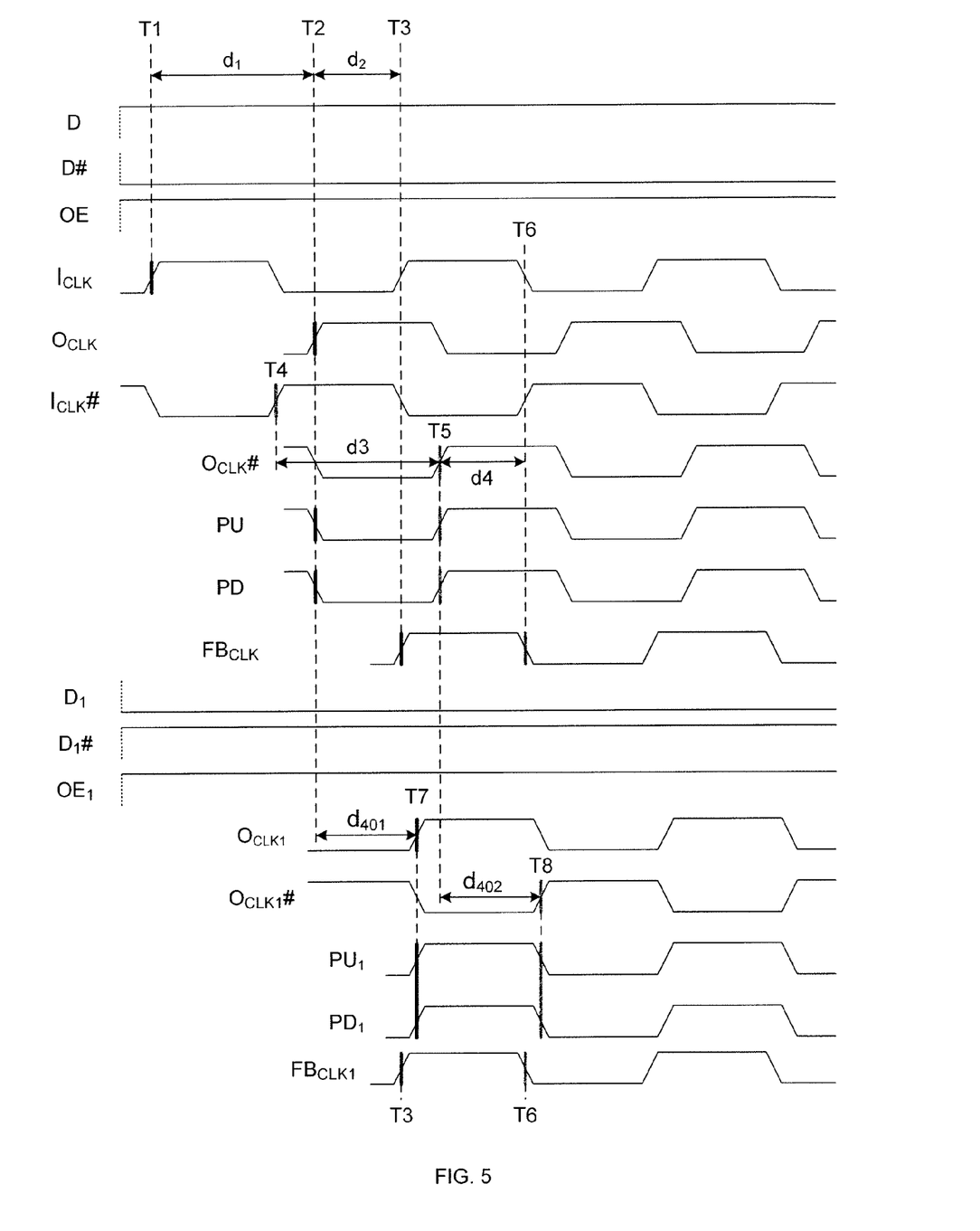
FIG. 5 is a waveform diagram illustrating the pull-up and pull-down control signals generated by the circuitry of FIG. 4, in accordance with one embodiment of the present invention.

FIG. 5 is a waveform diagram illustrating the manner in which output register/pre-driver 415 generates the pull-up and pull-down control signals $PU_1$ and $PD_1$ in response to the above-described input signals. FIG. 5 also illustrates the signals associated with output register/pre-driver 115 for reference purposes. Note that the signals associated with output register/pre-driver 115 (i.e., D, D#, OE, $O_{CLK}$, $O_{CLK}\#$, PU and PD) are described above in connection with FIG. 2. As described in more detail below, terminated load module 302 is designed such that the feedback clock signal $FB_{CLK1}$ of reference output circuit 300 is identical to the feedback clock signal $FB_{CLK}$ of reference output circuit 100 (FIG. 1).

Turning now to FIG. 5, delay circuit 401 introduces a delay (d401) to the output clock signal $O_{CLK}$ to create the output clock signal $O_{CLK1}$. Thus, output clock signal $O_{CLK}$ and $O_{CLK1}$ exhibit rising edges at times T2 and T7, respectively, wherein these times T2 and T7 are separated by delay d401. Output register/pre-driver circuit 415 drives the pull-up and pull-down signals $PU_1$ and $PD_1$ to logic high states in response to the rising edge of the delayed output clock signal $O_{CLK1}$. (The inherent delay of output register/pre-driver 415 is not illustrated in FIG. 5 for purposes of clarity). Thus, the pull-up and pull-down signals $PU_1$ and $PD_1$ are each driven to a logic high state at time T7.

Note that the pull-up and pull-down control signals $PU_1$ and $PD_1$ are driven high in response to a rising edge of the delayed output clock signal $O_{CLK1}$, while the pull-up and pull-down signals PU and PD are driven low in response to a rising edge of the output clock signal $O_{CLK}$. The polarity of the PU/PD signals are opposite the polarity of the $PU_1/PD_1$ signals because the driver control signals D/D# are opposite in polarity to the driver control signals $D_1/D_1\#$, respectively.

The delay d401 introduced by delay circuit 401 is selected such that the pull-up and pull-down signals $PU_1$ and $PD_1$ do not transition to logic high states until after the feedback clock signal $FB_{CLK1}$ has risen to at least 80 percent of the full $FB_{CLK1}$ voltage swing (i.e., until after the feedback clock signal $FB_{CLK1}$ has clearly 'switched' to a logic high state). As described in more detail below, the $FB_{CLK1}$ signal transitions from a low voltage of $(0.25)V_{DD}$ to a high voltage of $(0.75)V_{DD}$. Thus, when the feedback clock signal $FB_{CLK1}$ is transitioning to a logic high state, pull-up transistor 341 in terminated load circuit 302 remains on until the feedback clock signal $FB_{CLK1}$ rises to at least $(0.25+0.5*0.8)V_{DD}$. As a result, pull-up transistor 341 assists the transition of the feedback clock signal $F_{BCLK1}$ to a logic high state. Stated another way, terminated load module 302 helps the output driver module 120 to pull up the voltage of the feedback clock signal $FB_{CLK1}$ during the rising transition of the feedback clock signal $FB_{CLK1}$.

After the feedback clock signal $FB_{CLK1}$ has switched to the logic high state, the pull-up and pull-down signals $PU_1$ and $PD_1$ transition to logic high states at time T7, thereby turning on NMOS pull-down transistor 342 and turning off PMOS pull-up transistor 341. At this time, the turned on NMOS pull-down transistor 342 in terminated load module 302 drives against the turned on PMOS pull-up transistor 121 in output buffer module 120, thereby establishing a desired DC level (e.g., approximately $(0.75)V_{DD}$) for the feedback clock signal $FB_{CLK1}$ prior to the next transition.

Delay circuit 402 introduces a delay (d402) to the complementary output clock signal $O_{CLK}\#$ to create the delayed complementary output clock signal $O_{CLK1}\#$. Thus, complementary output clock signals $O_{CLK}\#$ and $O_{CLK1}\#$ exhibit rising edges at times T5 and T8, respectively, wherein these times T5 and T8 are separated by delay d402. Output register/pre-driver 415 drives the pull-up and pull-down signals $PU_1$ and $PD_1$ to logic low states in response to the rising edge of the delayed output clock signal $O_{CLK1}\#$. (The inherent delay of output register/pre-driver 415 is not illustrated in FIG. 5 for purposes of clarity). Thus, the pull-up and pull-down signals $PU_1$ and $PD_1$ are each driven to a logic low state at time T8.

The delay d402 introduced by delay circuit 402 is selected such that the pull-up and pull-down signals $PU_1$ and $PD_1$ do not transition to logic low states until after the feedback clock signal $FB_{CLK1}$ has fallen to at 20 percent (or less) of the full $FB_{CLK1}$ voltage swing (i.e., until after the feedback clock signal $FB_{CLK1}$ has clearly 'switched' to a logic low state). Thus, when the feedback clock signal $FB_{CLK1}$ is transitioning to a logic low state, pull-down transistor 342 in terminated load circuit 302 remains on until the feedback clock signal $FB_{CLK1}$ falls to at least $(0.25+0.5*0.2)V_{DD}$. As a result, pull-down transistor 342 assists the transition of the feedback clock signal $FB_{CLK1}$ to a logic low state. Stated another way, terminated load module 302 helps the output driver module 120 to pull down the voltage of the feedback clock signal $FB_{CLK1}$ during the falling transition of the feedback clock signal $FB_{CLK1}$.

After the feedback clock signal $FB_{CLK1}$ has switched to the logic low state, the pull-up and pull-down signals $PU_1$ and $PD_1$ transition to logic low states, thereby turning on PMOS pull-up transistor 341 and turning off NMOS pull-down transistor 342. At this time, the turned on PMOS pull-up transistor 341 in terminated load module 302 drives against the turned on NMOS pull-down transistor 122 in output buffer module 120, thereby establishing a desired DC level (e.g., approximately $(0.25)V_{DD}$) for the feedback clock signal $FB_{CLK1}$ prior to the next transition. Selecting delays d401 and d402 in the above-described manner ensures reliable operation of comparator 104.

Using the switching terminated load module 302 in the above-described manner advantageously allows the impedance of terminated load module 302 to be updated during each clock cycle, without disrupting the $FB_{CLK1}$ signal or requiring a quarter cycle delay. More specifically, the impedance of the pull-up circuit 331 can be updated during the portion of the clock cycle that this pull-up circuit 331 is turned off (i.e., between times T7 and T8). Similarly, the impedance of the pull-down circuit 332 can be updated during the portion of the clock cycle that this pull-down circuit 332 is turned off. In this manner, the present invention solves the problem associated with updating the impedance of the terminated load module 102 (FIG. 1).

To make the voltages of the feedback clock signal $FB_{CLK1}$ consistent with feedback clock signal $FB_{CLK}$, the logic high voltage of the $FB_{CLK1}$ signal should be equal to $(0.75)V_{DD}$ Volts, and the logic low voltage of the $FB_{CLK1}$ signal should be equal to $(0.25)V_{DD}$ Volts. To accomplish this, the resistances $R_X$ and $R_Y$ of resistors 351 and 552 are selected such that the effective DC resistance of the terminated load module 302 is equal to three times the effective DC resistance of output buffer module 120. For example, the resistance $R_X$ is selected such that $R_X+K_P/2W_P=3\times(R_0+K_P/2W_P)$. This equation can be simplified as follows:

$$R_X=3R_0+3K_P/2W_P-K_P/2W_P \quad (1)$$

$$R_X=3R_0+2K_P/2W_P \quad (2)$$

$$R_X=3R_0+K_P/W_P \quad (3)$$

Similarly, the resistance $R_Y$ is selected such that $R_Y+K_N/2W_N=3\times(R_0+K_N/2W_N)$. This equation can be simplified as follows:

$$R_Y=3R_0+3K_N/2W_N-K_N/2W_N \quad (4)$$

$$R_Y=3R_0+2K_N/2W_N \quad (5)$$

$$R_Y=3R_0+K_N/W_N \quad (6)$$

To make the delay of the feedback clock signal $FB_{CLK1}$ consistent with the delay of feedback clock signal $FB_{CLK}$, the delay at the cross-over voltage of $V_{DD}/2$ should be equal for both signals. To accomplish this, the voltage equations associated with rising edges of feedback clock signals $FB_{CLK}$ and $FB_{CLK1}$ should first be derived. The voltage of a charging series-connected resistive-capacitive (RC) circuit is defined by the following equation:

$$V(t)=V_{SS}+V_N \quad (7)$$

wherein $V(t)$ represents the capacitor voltage at time (t), $V_{SS}$ represents the steady state voltage of the RC circuit, and $V_N$ represents the natural response of the RC circuit. The natural response $V_N$ is equal to $Ke^{-t/RC}$, where K is a constant.

Figure 6A:
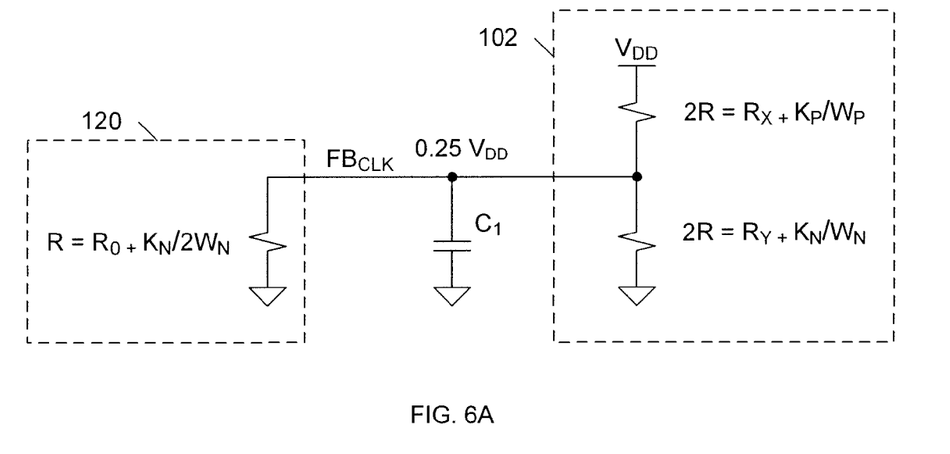
FIGS. 6A and 6B are circuit diagrams illustrating the configuration of a conventional output buffer module and a conventional terminated load module 102 during pull-down and pull-up conditions, respectively.
Figure 6B:
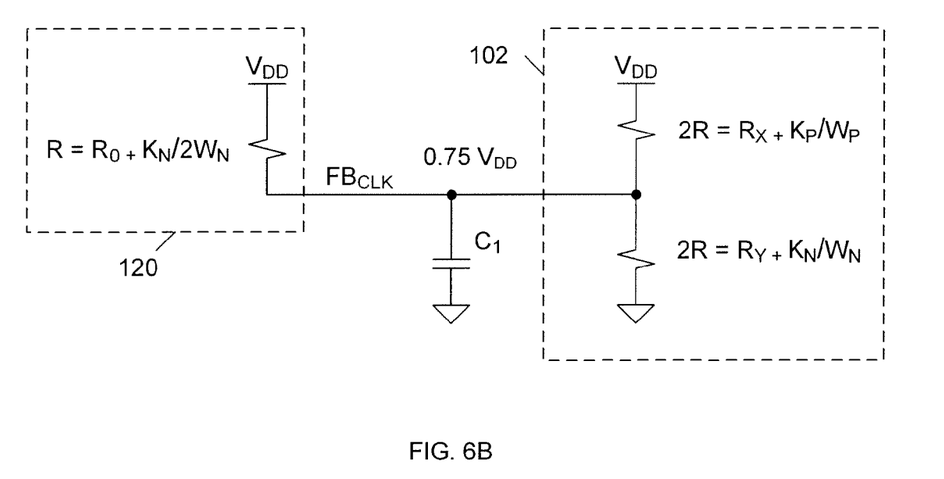

FIGS. 6A and 6B illustrate output buffer module 120 and terminated load module 102 of output reference circuit 100 when the feedback clock signal $FB_{CLK}$ is in a logic low state $(0.25)V_{DD}$ and a logic high state $(0.75)V_{DD}$, respectively. Output buffer module 120 transitions from the configuration of FIG. 6A to the configuration of FIG. 6B for a rising edge of the $FB_{CLK}$ signal. Thus, the steady state voltage $V_{SS}$ associated with the rising edge of the $FB_{CLK}$ signal is equal to $(0.75)V_{DD}$.

Immediately after the configuration of output buffer module 120 switches from FIG. 6A to 6B (i.e., at time=0+), the voltage on capacitor 103 remains unchanged at $(0.25)V_{DD}$. Thus, equation (7) can be rewritten as follows at time=0+.

$$(0.25)V_{DD}=(0.75)V_{DD}+Ke^{-0/R1C1} \quad (8)$$

Because $Ke^{-0/R1C1}$ is equal to K, equation (8) can be simplified as follows.

$$(0.25)V_{DD}=(0.75)V_{DD}+K \quad (9)$$

$$K=(0.25)V_{DD}-(0.75)V_{DD} \quad (10)$$

$$K=-(0.5)V_{DD} \quad (11)$$

Thus, the following equations apply to reference output circuit 100.

$$V_{FBCLK}(t)=(0.75)V_{DD}-(0.5)V_{DD}e^{-t/R1C1} \quad (12)$$

$$V_{FBCLK}(t)=V_{DD}(0.75-0.5e^{-t/R1C1}) \quad (13)$$

Figure 6C:
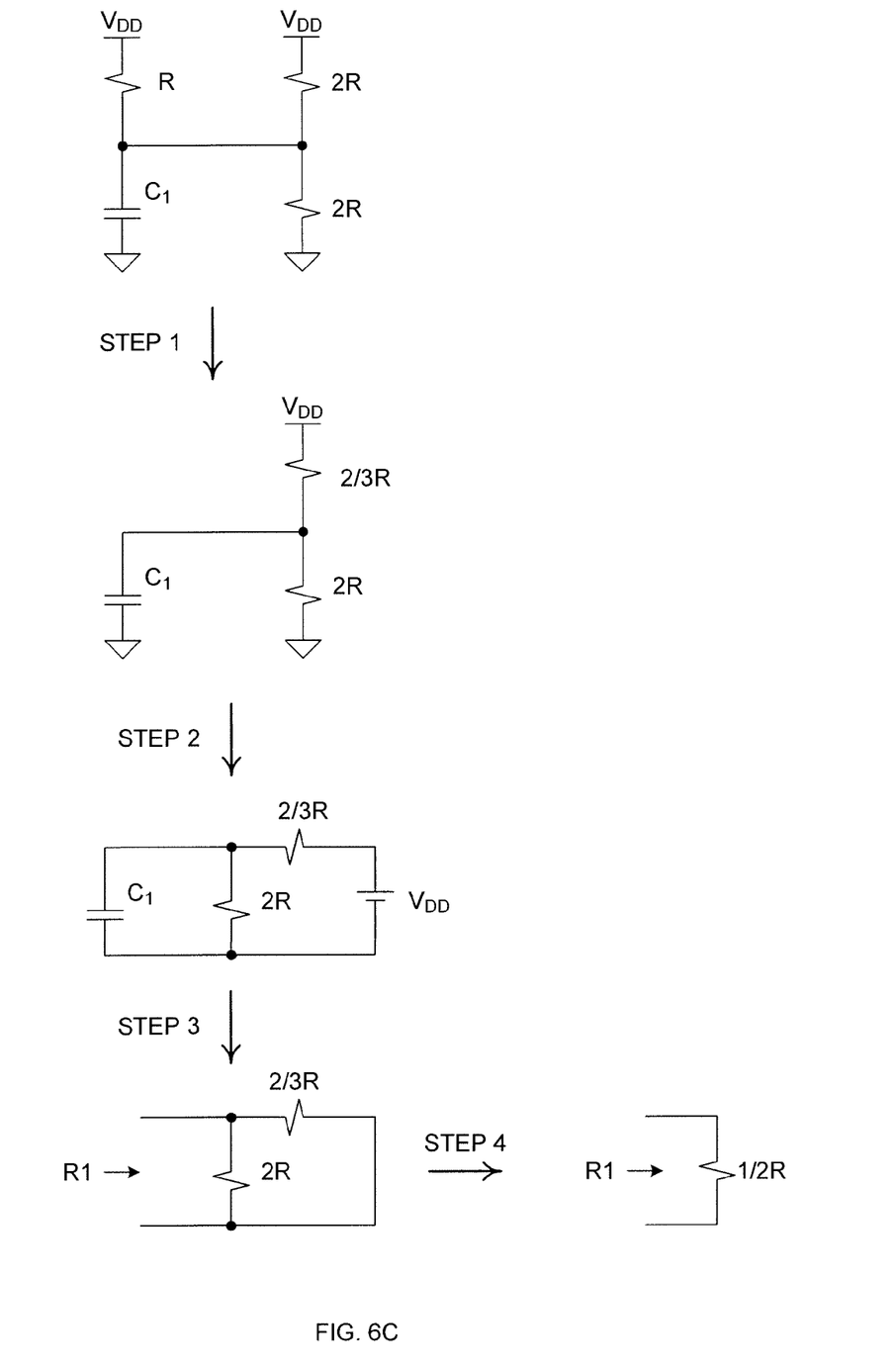
FIG. 6C is a series of circuit diagrams that illustrate the derivation of the charging resistance of the circuit of FIG. 6B.

The capacitance C1 is the total feedback capacitance of feedback clock signal $FB_{CLK}$ (including the capacitance $C_0$ of capacitor 103 and any parasitic capacitances). The resistance R1 is determined from the Thevenin equivalent of the charging circuit, which is derived in FIG. 6C. As illustrated in FIG. 6C, the parallel resistances R and 2R are equivalent to a single resistance of $(2/3)R$ (Step 1). The resulting circuit can be represented as two loops (Step 2). The Thevenin equivalent resistance seen by the charging capacitance C1 is determined by shorting the $V_{DD}$ voltage supply (Step 3). Finally, the parallel resistances of 2R and $(2/3)R$ are equivalent to a single resistance of ½R (Step 4). Thus, the Thevenin equivalent resistance R1 is equal to ½R. Substituting into equation (13) provides the following equation.

$$V_{FBCLK}(t)=V_{DD}(0.75-0.5e^{-2t/RC1}) \quad (14)$$

Figure 7A:
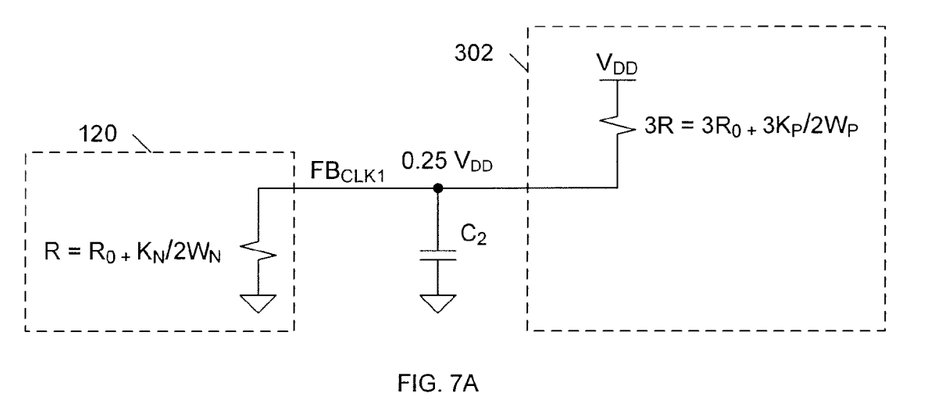
FIGS. 7A, 7B and 7C are circuit diagrams illustrating an output buffer module and a terminated load module of the present invention, wherein a feedback clock signal is in a logic low state (FIG. 7A), in a first switching configuration to a logic high state (FIG. 7B), and in a final switching configuration to the logic high state (FIG. 7C).
Figure 7B:
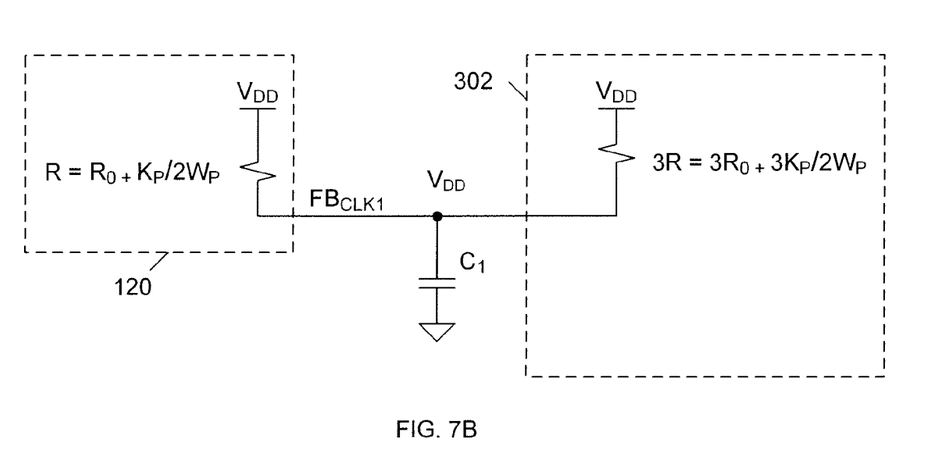
Figure 7C:
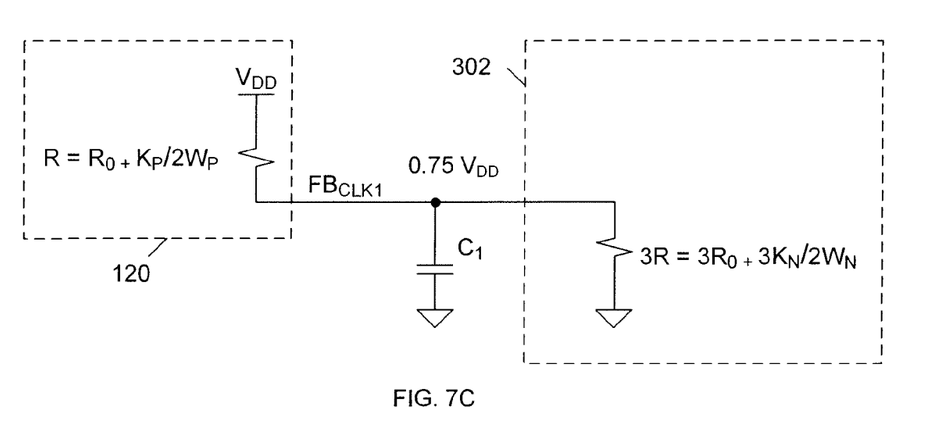

The same analysis will now be performed for reference output circuit 300. FIGS. 7A, 7B and 7C are circuit diagrams illustrating output buffer module 120 and terminated load module 302 of output reference circuit 300 when the feedback clock signal $FB_{CLK1}$ is in a logic low state $(0.25V_{DD})$, in a first switching configuration to a logic high state, and in the final switching configuration to the logic high state, respectively.

Output buffer module 120 and terminated load module 302 transition from the configuration of FIG. 7A to the configuration of FIG. 7B for a rising edge of the $FB_{CLK1}$ signal. Thus, the steady state voltage $V_{SS}$ associated with the rising edge of the $FB_{CLK1}$ signal is equal to $V_{DD}$. (Note that the $FB_{CLK1}$ signal transitions to a final voltage of $0.75V_{DD}$ after switching to the configuration of FIG. 7C.)

Immediately after the configuration of output buffer module 120 switches from FIG. 7A to 7B (i.e., at time=0+), the voltage on capacitor 303 remains unchanged at $(0.25)V_{DD}$. Thus, equation (7) can be rewritten as follows at time=0+.

$$(0.25)V_{DD}=V_{DD}+Ke^{-0/R2C2} \quad (15)$$

Because $Ke^{-0/R2C2}$ is equal to K, equation (15) can be simplified as follows.

$$(0.25)V_{DD}=V_{DD}+K \quad (16)$$

$$K=(0.25)V_{DD}-V_{DD} \quad (17)$$

$$K=-(0.75)V_{DD} \quad (18)$$

Thus, the following equations apply to reference output circuit 300.

$$V_{FBCLK1}(t)=V_{DD}-0.75V_{DD}e^{-t/R2C2} \quad (19)$$

$$V_{FBCLK1}(t)=V_{DD}(1-0.75e^{-t/R2C2}) \quad (20)$$

The capacitance C2 is the total feedback capacitance of feedback clock signal $FB_{CLK1}$ (including the capacitance $C_X$ of capacitor 303 and any parasitic capacitances). The charging resistance R2 is determined by simplifying the charging circuit of FIG. 7B. As illustrated in FIG. 7B, the charging resistance is provided by parallel resistances R and 3R. These parallel resistances are equivalent to a single resistance of ¾R. The charging resistance R2 is therefore equal to ¾R. Substituting this charging resistance into equation (20) provides the following equation.

$$V_{FBCLK1}(t)=V_{DD}(1-0.75e^{-4t/3RC2}) \quad (21)$$

For reference output circuits 100 and 300 to have the same switching speed, the respective feedback clock signals $FB_{CLK}$ and $FB_{CLK1}$ should reach the switching voltage $V_{DD}/2$ at the same time (t). In order to accomplish this, the capacitances C1 and C2 should be selected in the manner described below. The switching voltage $V_{DD}/2$ can be substituted into equation (14) to create the following equation for reference output circuit 100.

$$V_{DD}/2 = V_{DD}(0.75 - 0.5e^{-2t/RC1}) \quad (22)$$

Equation (22) can be solved for the time 't' as follows.

$$\frac{1}{2} = (0.75 - 0.5e^{-2t/RC1}) \quad (23)$$

$$0.25 = 0.5e^{-2t/RC1} \quad (24)$$

$$0.5 = e^{-2t/RC1} \quad (25)$$

$$\ln(0.5) = -2t/RC1 \quad (26)$$

$$t = -\tfrac{1}{2}RC1 \ln(0.5) \quad (27)$$

Similarly, the switching voltage $V_{DD}/2$ can be substituted into equation (20) to create the following equation for reference output circuit 300.

$$V_{DD}/2 = V_{DD}(1 - 0.75e^{-4t/3RC2}) \quad (28)$$

Equation (28) can be solved for the time 't' as follows.

$$\frac{1}{2} = (1 - 0.75e^{-4t/3RC2}) \quad (29)$$

$$0.5 = 0.75e^{-4t/3RC2} \quad (30)$$

$$\tfrac{2}{3} = e^{-4t/3RC2} \quad (31)$$

$$\ln(\tfrac{2}{3}) = -4t/3RC2 \quad (32)$$

$$t = -\tfrac{3}{4}RC2 \ln(\tfrac{2}{3}) \quad (33)$$

For the switching time t in equation (27) to equal the switching time t in equation (33), the following must be true.

$$-\tfrac{1}{2}RC1 \ln(0.5) = -\tfrac{3}{4}RC2 \ln(\tfrac{2}{3}) \quad (34)$$

$$2(C1)\ln(0.5) = 3(C2)\ln(\tfrac{2}{3}) \quad (35)$$

$$-1.3863(C1) = -1.2164(C2) \quad (36)$$

$$C2 = 1.14(C1) \quad (37)$$

Thus, the switching time of output reference circuit 300 can be set equal to the switching time of output reference circuit 100 by adjusting the capacitance $C_X$ of output reference circuit 300 such that the total feedback capacitance C2 of feedback clock signals $FB_{CLK1}$ is equal to 1.14 times the total feedback capacitance C1 of feedback clock signal $FB_{CLK}$. Advantageously, the terminated load module 302 of the present invention does not slow down the switching of the feedback clock signal $FB_{CLK1}$ with respect to the switching of feedback clock signal $FB_{CLK}$.

Figure 8:
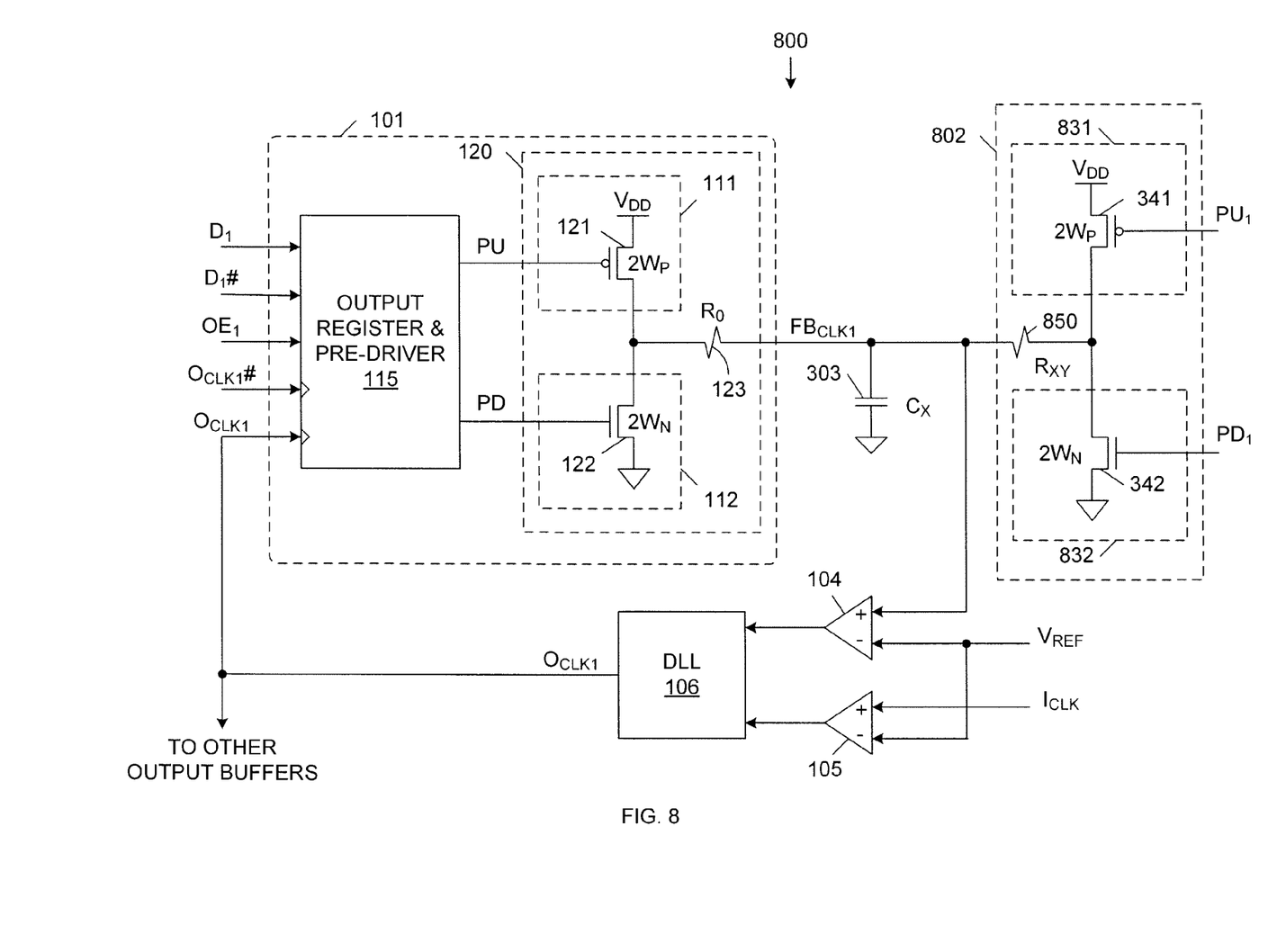
FIG. 8 is a circuit diagram of a reference output circuit having a simplified terminated load module in accordance with another embodiment of the present invention.

FIG. 8 is a circuit diagram of a reference output circuit 800 having a simplified terminated load module 802 in accordance with another embodiment of the present invention. Because reference output circuit 800 is similar to reference output circuit 300 (FIG. 3), similar elements in FIGS. 3 and 8 are labeled with similar reference numbers. Reference output circuit 800 includes a terminated load module 802 having a pull-up circuit 831 (i.e., PMOS pull-up transistor 341), a pull-down circuit 832 (i.e., NMOS pull-down transistor 342), and a single resistor 850. As described above, the resistance value $K_P/W_P$ should be about the same as the resistance value $K_N/W_N$, so that the number of output driver modules being used can be kept to a minimum. If the resistance value $K_P/W_P$ is about the same as the resistance value $K_N/W_N$, then resistors 351 and 352 can be eliminated, and replaced with a single resistor 850, as illustrated in FIG. 8. Resistor 850 has a resistance $R_{XY}$, which is defined as follows in accordance with on embodiment of the present invention.

$$R_{XY} = 3R_0 + 0.5(K_P/W_P + K_N/W_N) \quad (38)$$

Thus, the pull-up resistance ($R_{P1}$) of terminated load module 802 (i.e., the resistance of terminated load module when PMOS pull-up transistor 341 is on and NMOS pull-down transistor 342 is off) can be defined as follows.

$$R_{P1} = R_{XY} + K_P/2W_P \quad (39)$$

$$R_{P1} = 3R_0 + 0.5(K_P/W_P + K_N/W_N) + K_P/2W_P \quad (40)$$

$$R_{P1} = 3R_0 + K_P/W_P + 0.5(K_N/W_N) \quad (41)$$

Similarly, the pull-down resistance ($R_{N1}$) of terminated load module 802 (i.e., the resistance of terminated load module when PMOS pull-up transistor 341 is off and NMOS pull-down transistor 342 is on) can be defined as follows.

$$R_{N1} = R_{XY} + K_N/2W_N \quad (42)$$

$$R_{N1} = 3R_0 + 0.5(K_P/W_P + K_N/W_N) + K_N/2W_N \quad (43)$$

$$R_{N1} = 3R_0 + K_N/W_N + 0.5(K_P/W_P) \quad (44)$$

For a terminated pull-up configuration (i.e., PMOS pull-up transistor 341 is on and NMOS pull-down transistor 342 is off), the resistance error is equal to:

$$(3R_P - R_{P1})/3R_P \quad (45)$$

$$\frac{(3(R_0 + K_P/2W_P) - (3R_0 + K_P/W_P + K_N/2W_N))}{3(R_0 + K_P/2W_P)} \quad (46)$$

$$(3K_P/2W_P - K_P/W_P - K_N/2W_N)/(3R_0 + 3K_P/2W_P) \quad (47)$$

$$(K_P/2W_P - K_N/2W_N)/(3R_0 + 3K_P/2W_P) \quad (48)$$

$$(K_P/W_P - K_N/W_N)/(6R_0 + 3K_P/W_P) \quad (49)$$

Similarly, for a terminated pull-down configuration (i.e., PMOS pull-up transistor 341 is off and NMOS pull-down transistor 342 is on), the resistance error in percent is equal to:

$$(3R_N - R_{N1})/3R_N \quad (50)$$

$$\frac{(3(R_0 + K_N/2W_N) - (3R_0 + K_N/W_N + K_P/2W_P))}{3(R_0 + K_N/2W_N)} \quad (51)$$

$$(3K_N/2W_N - K_N/W_N - K_P/2W_P)/(3R_0 + 3K_N/2W_N) \quad (52)$$

$$(K_N/2W_N - K_P/2W_P)/(3R_0 + 3K_N/2W_N) \quad (53)$$

$$(K_N/W_N - K_P/W_P)/(6R_0 + 3K_N/W_N) \quad (54)$$

In one example, $R_0$ is 500 Ohms, $K_P/2W_P$ is 100 Ohms, and $K_N/2W_N$ is 90 Ohms, such that there is a 10 percent mismatch between $K_P/W_P$ and $K_N/W_N$. $N_P$ represents the number of parallel output driver modules turned on to pull up the feedback clock signal $FB_{CLK1}$, and $N_N$ represents the number of parallel output driver modules turned on to pull down the feedback clock signal $FB_{CLK1}$. In this example, $R_P$ is equal to 600 Ohms ($R_0 + K_P/2W_P$); $R_N$ is equal to 590 Ohms ($R_0 + K_N/2W_N$); $R_{XY}$ is equal to 1690 Ohms (i.e., $3R_0 + 0.5(K_P/W_P + K_N/W_N)$); $R_{P1}$ is equal to 1790 Ohms (i.e., $R_{XY} + K_P/2W_P$) and RN1 is equal to 1780 Ohms (i.e., $R_{XY} + K_N/2W_N$) (Assuming that the impedance matching must match a resistance of 50

Ohms, then the resistance (R) of the output buffer modules is equal to 50 Ohms (i.e., $R_P/N_P = R_N/N_N = 50$ Ohms)).

As described above, the pull-up resistance ($R_{P1}$) of terminated load module 802 should be equal to three times the pull-up resistance ($R_P$) of the output buffer module 120, or 1800 Ohms (i.e., 600 Ohms×3). The resistance error introduced by the simplified terminated load module 802 is therefore approximately −0.56 percent (i.e., (1790−1800)/1800). This result is consistent with equation (54) above.

As described above, the pull-down resistance $R_{N1}$ of terminated load module 802 should be equal to three times the pull-down resistance $R_N$ of output buffer module 120, or 1770 Ohms (i.e., 590 Ohms×3). The resistance error introduced by the simplified terminated load module 802 is therefore approximately +0.56 percent (i.e., (1780−1770)/1770). This result is consistent with equation (55). Advantageously, the resistance errors introduced by simplified terminated load module 802 are relatively small.

In the above example, a fifteen percent change in the on-resistances of the MOS transistors 121 and 122 over the output voltage range will translate to a change of about 2.4 percent in the resistances $R_P$ and $R_N$. Similarly, a fifteen percent change in the on-resistances of MOS transistors 341 and 342 over the output voltage range will translate to a change of about 0.8 percent in the resistances $R_{P1}$ and $R_{N1}$.

In accordance with one embodiment of the present invention, the DC current flowing in output driver module 120 is equal to the DC current flowing in the terminated load module 802 (or terminated load module 302). Consequently, the electro-migration performance is the same in the output driver module 120 and the terminated load module 802 (or 302). Thus, the 4× electro-migration degradation present in terminated load module 102 is resolved by the present invention. In accordance with one embodiment, the resistance $R_{XY}$ is constructed with multiple resistances $R_0$ connected in series, such that the resistance $R_{XY}$ will have the same electro-migration performance as resistance $R_0$.

Although the present invention has been described in connection with various embodiments, it is understood that variations of these embodiments would be obvious to one of ordinary skill in the art. Thus, the present invention is limited only by the following claims.

I claim:

1. A reference output circuit comprising:
a control circuit that provides an output clock signal for driving one or more output signals from one or more corresponding output buffers, wherein the control circuit includes an output buffer circuit that provides a feedback clock signal in response to the output clock signal, and circuitry for generating the output clock signal in response to the feedback clock signal and an input clock signal, wherein the one or more output signals are synchronized with the input clock signal; and
a terminated load module coupled to receive the feedback clock signal, wherein the terminated load module switches between a pull-up configuration and a pull-down configuration in response to the output clock signal, wherein the terminated load module emulates terminated loads driven by the one or more output buffers.

2. The reference output circuit of claim 1, wherein the output buffer circuit is configured to switch between a pull-up configuration and a pull-down configuration in response to the output clock signal.

3. The reference output circuit of claim 2, wherein the output buffer circuit includes a pull-up transistor and a pull-down transistor, and the terminated load module includes a pull-up transistor and a pull-down transistor, wherein the pull-up transistor of the output buffer circuit is the same size as the pull-up transistor of the terminated load module, and the pull-down transistor of the output buffer circuit is the same size as the pull-down transistor of the terminated load module.

4. The reference output circuit of claim 2, wherein the output buffer circuit includes a pull-up transistor and a pull-down transistor, and the terminated load module includes a pull-up transistor and a pull-down transistor, wherein the pull-up transistor of the output buffer circuit has the same on-resistance as the pull-up transistor of the terminated load module, and the pull-down transistor of the output buffer circuit has the same on-resistance as the pull-down transistor of the terminated load module.

5. The reference output circuit of claim 2, wherein the output buffer circuit includes a pull-up transistor and a pull-down transistor, and the terminated load module includes a pull-up transistor and a pull-down transistor, wherein the pull-up transistor of the output buffer circuit, the pull-up transistor of the terminated load module, the pull-down transistor of the output buffer circuit and the pull-down transistor of the terminated load module all have approximately the same on-resistance.

6. The reference output circuit of claim 1, further comprising a delay circuit configured to provide a delayed output clock signal in response to the output clock signal, wherein the terminated load module is configured to switch between the pull-up configuration and the pull-down configuration in response to the delayed output clock signal.

7. A reference output circuit comprising:
a control circuit that provides an output clock signal for driving one or more output signals; and
a terminated load module that switches between a pull-up configuration and a pull-down configuration in response to the output clock signal, wherein the terminated load module emulates terminated loads driven by the output signals,
wherein the control circuit comprises circuitry for generating the output clock signal in response to a feedback clock signal and an input clock signal, the circuitry comprising:
a first comparator coupled to receive the feedback clock signal and a reference voltage signal associated with a cross-over voltage of the feedback clock signal and the input clock signal;
a second comparator coupled to receive the input clock signal and the reference voltage signal; and
a delay locked loop circuit coupled to receive output signals from the first and second comparators, and in response, provide the output clock signal.

8. A reference output circuit comprising:
a control circuit that provides an output clock signal for driving one or more output signals from one or more corresponding output buffers, wherein the control circuit includes an output buffer circuit that provides a feedback clock signal in response to the output clock signal, wherein the output buffer circuit is configured to switch between a pull-up configuration and a pull-down configuration in response to the output clock signal; and
a terminated load module coupled to receive the feedback clock signal, wherein the terminated load module switches between a pull-up configuration and a pull-down configuration in response to the output clock signal, wherein the terminated load module emulates terminated loads driven by the one or more output buffers; and a feedback path configured to receive the feedback clock signal from the output buffer circuit, wherein the feedback path includes a capacitor and the terminated load module.

9. A reference output circuit comprising:
a control circuit that provides an output clock signal for driving one or more output signals; and
a terminated load module that switches between a pull-up configuration and a pull-down configuration in response to the output clock signal, wherein the terminated load module emulates terminated loads driven by the output signals,
wherein the control circuit comprises circuitry for generating the output clock signal in response to a feedback clock signal and an input clock signal, the circuitry including an output buffer circuit configured to drive the feedback clock signal in response to the output clock signal, wherein the output buffer circuit is configured to switch between a pull-up configuration and a pull-down configuration, and
a feedback path configured to receive the feedback clock signal from the output buffer circuit, wherein the feedback path includes a capacitor and the terminated load module, wherein the output buffer circuit includes a pull-up transistor and a pull-down transistor, which are commonly coupled to a signal line of the feedback path through a first resistor, and the terminated load module includes a pull-up transistor coupled to the signal line through a second resistor, and a pull-down transistor coupled to the signal line through a third resistor, wherein the second and third resistors each have a resistance which is greater than a resistance of the first resistor.

10. The reference output circuit of claim 9, wherein the second and third resistors each have a resistance three times greater than the resistance of the first resistor.

11. A reference output circuit comprising:
a control circuit that provides an output clock signal for driving one or more output signals; and
a terminated load module that switches between a pull-up configuration and a pull-down configuration in response to the output clock signal, wherein the terminated load module emulates terminated loads driven by the output signals,
wherein the control circuit comprises circuitry for generating the output clock signal in response to a feedback clock signal and an input clock signal, the circuitry including an output buffer circuit configured to drive the feedback clock signal in response to the output clock signal, wherein the output buffer circuit is configured to switch between a pull-up configuration and a pull-down configuration, and
a feedback path configured to receive the feedback clock signal from the output buffer circuit, wherein the feedback path includes a capacitor and the terminated load module, wherein the output buffer circuit includes a pull-up transistor and a pull-down transistor, which are commonly coupled to a signal line of the feedback path through a first resistor, and the terminated load module includes a pull-up transistor and a pull-down transistor, which are commonly coupled to the signal line of the feedback path through a second resistor, wherein the second resistor has a resistance greater than a resistance of the first resistor.

12. The reference output circuit of claim 11, wherein the resistance of the second resistor is about three times greater than the resistance of the first resistor.

13. A method of driving signals off of an integrated circuit chip, the method comprising:
generating an output clock signal;
driving one or more signals off of the integrated circuit chip to one or more corresponding terminated loads in response to the output clock signal;
switching a terminated load circuit on the integrated circuit chip in response to the output clock signal, wherein the terminated load circuit emulates the terminated loads located off of the integrated circuit chip;
driving a feedback clock signal to a first logic state in response to a first transition of the output clock signal, wherein the feedback clock signal is driven to the first logic state by:
turning on a pull-up transistor in an output buffer circuit;
turning on a pull-up transistor in the terminated load circuit;
turning off a pull-down transistor in the output buffer circuit;
turning off a pull-down transistor in the terminated load circuit; and then
turning off the pull-up transistor in the terminated load circuit and turning on the pull-down transistor in the terminated load circuit after the feedback clock signal has been driven to the first logic state.

14. The method of claim 13, further comprising:
driving the feedback clock signal to a second logic state in response to a second transition of the output clock signal, wherein the feedback clock signal is driven to the second logic state by:
turning on the pull-down transistor in the output buffer circuit;
maintaining the pull-down transistor in the terminated load circuit in a turned on condition;
turning off the pull-up transistor in the output buffer circuit;
maintaining the pull-up transistor in the terminated load circuit in a turned off condition; and then
turning off the pull-down transistor in the terminated load circuit and turning on the pull-up transistor in the terminated load circuit after the feedback clock signal has been driven to the second logic state.

15. The method of claim 14, further comprising adjusting an on-resistance of the pull-up transistor of the terminated load circuit when the pull-up transistor of the terminated load module is turned off.

16. The method of claim 15, further comprising adjusting an on-resistance of the pull-down transistor of the terminated load circuit when the pull-down transistor of the terminated load module is turned off.

* * * * *